United States Patent
Väätäinen et al.

(10) Patent No.: US 8,800,640 B2
(45) Date of Patent: Aug. 12, 2014

(54) COOLED BASE PLATE FOR ELECTRIC COMPONENTS

(75) Inventors: Timo Väätäinen, Espoo (FI); Timo Koivuluoma, Vantaa (FI)

(73) Assignee: ABB Oy, Helsinki (FI)

( * ) Notice: Subject to any disclaimer, the term of this patent is extended or adjusted under 35 U.S.C. 154(b) by 357 days.

(21) Appl. No.: 12/883,548

(22) Filed: Sep. 16, 2010

(65) Prior Publication Data

US 2011/0061834 A1  Mar. 17, 2011

(30) Foreign Application Priority Data

Sep. 17, 2009  (FI) .................................... 20095959

(51) Int. Cl.
 F28F 7/00 (2006.01)
 F28F 13/00 (2006.01)
 H01L 23/473 (2006.01)
 H05K 7/20 (2006.01)

(52) U.S. Cl.
 CPC .......... H01L 23/473 (2013.01); H05K 7/20254 (2013.01)
 USPC ........................................ 165/80.4; 165/146

(58) Field of Classification Search
 CPC ..... H01L 23/36; H01L 23/367; H01L 23/473; H01L 23/427; H05K 7/20254; H05K 7/20509; H05K 7/20518
 USPC ......... 165/146, 147, 80.4, 168, 171; 361/699, 361/700
 See application file for complete search history.

(56) References Cited

U.S. PATENT DOCUMENTS

| | | | |
|---|---|---|---|
| 4,953,634 A * | 9/1990 | Nelson et al. .................. | 165/147 |
| 5,072,787 A * | 12/1991 | Nakamichi .................. | 165/80.3 |
| 2006/0237166 A1* | 10/2006 | Otey et al. .................... | 165/80.4 |
| 2007/0177348 A1 | 8/2007 | Kehret et al. | |
| 2007/0256810 A1* | 11/2007 | Di Stefano et al. ............. | 165/46 |
| 2007/0289718 A1* | 12/2007 | McCordic et al. ........... | 165/80.4 |
| 2009/0056916 A1* | 3/2009 | Yesin et al. .............. | 165/104.21 |

FOREIGN PATENT DOCUMENTS

WO  2009037648  3/2009

OTHER PUBLICATIONS

*Finnish Search Report for FI 20095959 dated May 18, 2010.
Office Action dated Feb. 1, 2013, issued in corresponding Chinese Patent Application No. 201010285632.9 (with English translation).

* cited by examiner

*Primary Examiner* — Allan Lewin
*Assistant Examiner* — Dawit Muluneh
(74) *Attorney, Agent, or Firm* — Buchanan Ingersoll & Rooney PC

(57) ABSTRACT

A cooled base plate is provided for electric components. A first side of the cooled base plate is provided for attaching exothermal electric components thereto. On a second side of the base plate, opposite to the first side, there is embedded a cooling channel system having a cooling fluid inlet at a first end of the base plate and a cooling fluid outlet at a second end of the base plate. In order to minimize differences in temperature between the electric components, the thickness of the base plate increases in the direction from the inlet of the cooling channel system towards the outlet of the cooling channel system, e.g., in the flow direction of the cooling fluid, for at least a portion of the length of the base plate.

8 Claims, 2 Drawing Sheets

COOLED BASE PLATE FOR ELECTRIC COMPONENTS

RELATED APPLICATIONS

This application claims priority under 35 U.S.C. §119 to Finnish Patent Application No. 20095959 filed in Finland on Sep. 17, 2009, the entire content of which is hereby incorporated by reference in its entirety.

FIELD

The present disclosure relates to a cooled base plate for electric components.

BACKGROUND INFORMATION

A known base plate cooling structure is based on a simple and inexpensive technology employed in car radiators, in which a cooling fluid, such as a cooling liquid, is fed at one end of a base plate into one inlet pipe, wherefrom the fluid is distributed into flow channels of the base plate and is discharged through one outlet pipe at the opposite end of the base plate into the cooling system.

However, a long flow channel can lead to an imbalance in temperature. This imbalance can arise when the cooling liquid becomes warm as it propagates in the flow channel, whereby a base plate of symmetrical dimensions is unable to transfer heat evenly to the warmer and warmer cooling liquid. Accordingly, as the cooling liquid gets gradually warmer, an exothermal electric component at the last position in the cooling circulation, such as a loss source, e.g. a semiconductor module or a resistor, may run the hottest.

SUMMARY

An exemplary embodiment provides a cooled base plate for electric components. The exemplary base plate includes a first side configured for attaching exothermal electric components thereto. The exemplary base plate also includes a second side, opposite to the first side, into which a cooling channel system is embedded. The cooling system has a cooling fluid inlet at a first end of the base plate and a cooling fluid outlet at a second end of the base plate. A thickness of the base plate increases in a direction from the inlet of the cooling channel system towards the outlet of the cooling channel system corresponding to a flow direction of a cooling fluid for at least a portion of the length of the base plate. The cooling channel system is embedded at a substantially even distance from the first surface onto which the electric components are attachable.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a base plate in which the thickness of the base plate increases in a direction from the inlet of the cooling channel system towards the outlet of the cooling channel system, e.g., in the flow direction of the cooling fluid for at least a portion of the length of the base plate. According to exemplary embodiments of the present disclosure, the cooling system can be embedded at a substantially even distance from the surface provided for the attachment of the electric components.

Accordingly, exemplary embodiments of the present disclosure provide a base plate that is asymmetrical in thickness and that allows temperature equalization of electric loss sources.

Exemplary embodiments of the present disclosure provide savings in material, which results in both reduced mass of the base plate and in cost savings. For example, the base plate may be made thinner at the beginning of cooling circulation, when the cooling fluid is still cold, while the base plate can have its maximum thickness at the end of the cooling circulation, where larger heat transfer mass or surface area will be needed for transferring heat to heated cooling liquid.

Figure 1:
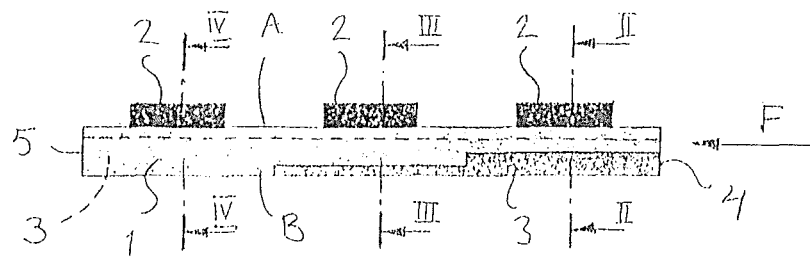
FIG. 1 is a side view of an exemplary base plate according to an embodiment of the present disclosure.
Figure 2:
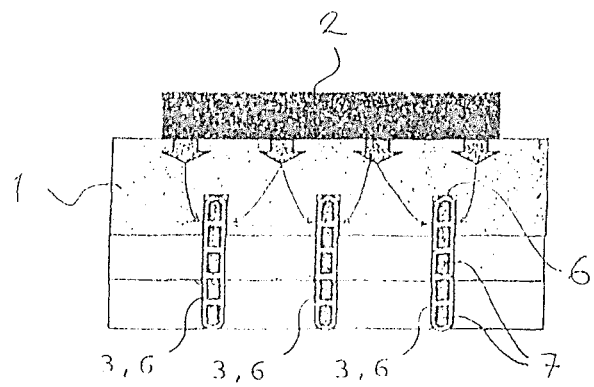
FIG. 2 is a cross-sectional view of the base plate of FIG. 1 at point II-II.
Figure 3:
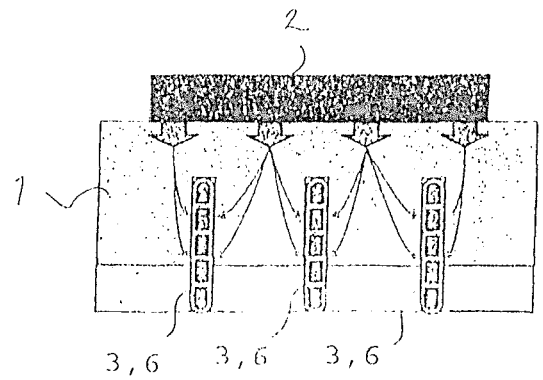
FIG. 3 is a cross-sectional view of the base plate of FIG. 1 at point III-III.
Figure 4:
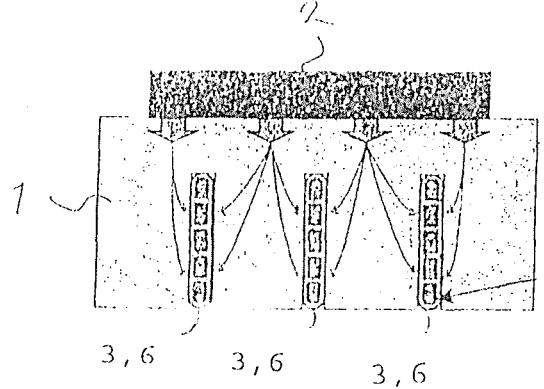
FIG. 4 is a cross-sectional view of the base plate of FIG. 1 at point IV-IV.

Exemplary embodiments of the present disclosure are illustrated in the drawings. For example, FIG. 1 illustrates an exemplary embodiment of a cooled base plate 1 for electric components according to the present disclosure. The cooled base plate 1 has a first side A (upper side in the drawings) to which exothermal electric components 2, such as semiconductor modules and resistors, may be attached. The cooled base plate 1 also has a second side B, (lower side in the drawings), which is opposite to the first side A. In the second side B of the cooled base plate 1, there is embedded a cooling channel system 3 having a cooling fluid inlet 4 at a first end of the base plate 1, and a cooling fluid outlet 5 at a second end of the base plate 1 opposite to the first end of the base plate 1.

According to an exemplary embodiment, the thickness of the base plate 1 increases in the direction from the inlet 4 of the cooling channel system 3 towards the outlet 5 of the cooling channel system 5, i.e. in the flow direction F of the cooling fluid for at least a portion of the length of the base plate 1. In other words, the thickness of the base plate 1 is reduced at the beginning of the cooling fluid flow.

In the exemplary embodiments of FIGS. 1 to 4, the thickness of the base plate 1 increases stepwise. For example, the thickness of the base plate 1 can increase stepwise in the region of every exothermal electric component 2 or electric component array that is next in the flow direction F of the cooling fluid.

Figure 5:
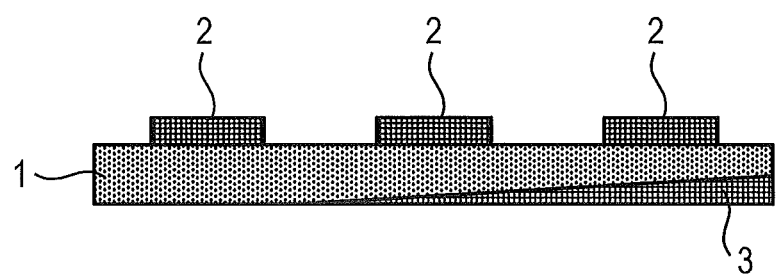
FIGS. 5 and 6 are side views of other exemplary embodiments of a base plate according to present disclosure.

In the exemplary embodiment of FIG. 5, the thickness of the base plate 1 increases at first continuously for a portion of the length of the base plate 1, with the rest of the base plate 1 being substantially uniform in thickness in the region of the last electric component 2 or electric component array.

Figure 6:
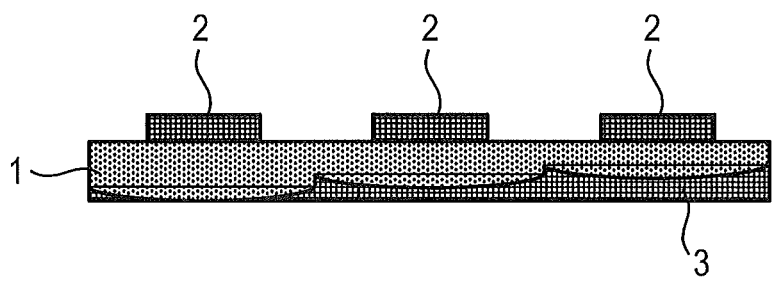

In accordance with the exemplary embodiment illustrated in FIG. 6, the thickness of the base plate 1 can increase as successive, protruding, e.g., convex, wavy areas in the region of every exothermal electric component or electric component array that is next in the flow direction F of the cooling fluid.

Areas of the base plate 1 that rise in the form of columns can also be possible, or these areas can be associated with the base plates 1 having the shape as described above. All these alternatives have not been illustrated in the drawings, because the base plate shape that is asymmetrical and varying in thickness in accordance with exemplary embodiments of the present disclosure can be implemented in a variety of ways within the scope of the present disclosure.

According to an exemplary embodiment, the cooling channel system 3 associated with the base plate 1 can include separate, finned pipes that are embedded in grooves 6 machined in the base plate 1 at a substantially even distance from a surface A provided for the attachment of electric components. In this example, the base plate's heat transfer surface including the grooves in the base plate 1 and associated with the finned rib pipes 3 increases in the flow direction F of the cooling fluid. Furthermore, in this example, the protrusion of the finned pipes 3 from the base plate 1 reduces respectively in the flow direction F of the cooling fluid. In this example, each finned pipe 3 can include several superimposed flow channels 7.

The electric component 2, which is on the side of the cooling fluid inlet 4 and receives liquid at its coldest and which is attached to the base plate 1 optimized in thickness in the above-described manner in accordance with the present disclosure, encounters the smallest heat transfer area. This heat transfer area then appropriately increases as the cooling liquid gets warmer, when it propagates towards the outlet 5, and consequently the difference in temperature between the electric components 2 is minimized irrespective of their location on the base plate 1 in view of the cooling fluid flow.

In addition, the shape of the base plate 1 can be optimized such that the internal temperature differences of the electric component 2 are to be minimized. For example, this arrangement can be implemented in the case of current semiconductors, when the length of a module may be even more than 300 mm. Examples of this include semiconductor chips in series, in connection with which temperature differences should be minimized, so that asymmetrical current distribution resulting from the temperature difference can be minimized. An optimized base plate 1 of this kind may be, for example, similar to the one shown in FIG. 6, in which the cooling area is the largest at a central area of the electric component array 2.

The above specification is only intended to illustrate the exemplary features of the present disclosure and the underlying concepts thereof. Thus, a person skilled in the art may modify its details within the scope of the attached claims. For example, the cooling channel system can include any appropriate pipes, and their cross-sectional shape is not restricted to the finned pipe structure, as the cross section of the pipe may be circular, for example. It is also conceivable that the channel system is provided in the base plate itself.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cooled base plate for electric components, the base plate comprising:
   a first side configured for attaching exothermal electric components thereto; and
   a second side, opposite to the first side, into which a cooling channel system is embedded, the cooling system having a cooling fluid inlet at a first end of the base plate and a cooling fluid outlet at a second end of the base plate,
   wherein a thickness of the base plate increases in a direction from the inlet of the cooling channel system towards the outlet of the cooling channel system corresponding to a flow direction of a cooling fluid for at least a portion of the length of the base plate, and
   wherein the cooling channel system is embedded at a substantially even distance from the first side onto which the electric components are attachable,
   wherein the cooling channel system comprises separate, finned pipes that are embedded in grooves provided in the base plate at a substantially even distance from the first side onto which the electric components are attachable, the grooves being substantially parallel to each other such that the separate, finned pipes respectively embedded therein are independent from each other entirely between the first and second ends of the base plate,
   wherein a heat transfer surface of the base plate including the grooves in the base plate and associated with the finned pipes increases in the flow direction of the cooling fluid, and
   wherein a protrusion of the finned pipes from the base plate reduces respectively in the flow direction of the cooling fluid.

2. The base plate of claim 1, wherein the thickness of the base plate increases in a stepwise fashion in the direction from the inlet of the cooling system towards the outlet of the cooling system.

3. The base plate of claim 1, wherein the thickness of the base plate increases continuously.

4. The base plate of claim 1, wherein the thickness of the base plate increases in successive, column-form areas in a region of at least one of successive exothermal electric component and electric component arrays that are next in the flow direction of the cooling fluid.

5. The base plate of claim 1, wherein each finned pipe comprises a plurality of superimposed flow channels.

6. The base plate of claim 2, wherein the thickness of the base plate increases stepwise in each region of at least one of successive exothermal electric components and electric component arrays that are next in the flow direction of the cooling fluid.

7. The base plate of claim 1, wherein the thickness of the base plate increases in the form of protruding, wavy areas in a region of at least one of successive exothermal electric components and electric component arrays that are next in the flow direction of the cooling fluid.

8. The base plate of claim 1, wherein the second side of the base plate has a continuously planar surface between the first and second ends of the base plate.

* * * * *